(12) United States Patent
Geurts

(10) Patent No.: US 10,560,649 B2
(45) Date of Patent: Feb. 11, 2020

(54) IMAGING SYSTEMS HAVING DUAL STORAGE GATE OVERFLOW CAPABILITIES

(71) Applicant: SEMICONDUCTOR COMPONENTS INDUSTRIES, LLC, Phoenix, AZ (US)

(72) Inventor: Tomas Geurts, Haasrode (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/900,136

(22) Filed: Feb. 20, 2018

(65) Prior Publication Data

US 2019/0260949 A1  Aug. 22, 2019

(51) Int. Cl.
*H04N 5/359* (2011.01)
*H04N 5/378* (2011.01)
*H04N 5/357* (2011.01)
*H04N 5/355* (2011.01)
*H01L 27/146* (2006.01)

(52) U.S. Cl.
CPC ....... *H04N 5/3597* (2013.01); *H01L 27/1461* (2013.01); *H01L 27/14609* (2013.01); *H01L 27/14612* (2013.01); *H01L 27/14636* (2013.01); *H01L 27/14645* (2013.01); *H04N 5/3559* (2013.01); *H04N 5/3577* (2013.01); *H04N 5/35554* (2013.01); *H04N 5/35581* (2013.01); *H04N 5/378* (2013.01)

(58) Field of Classification Search
None
See application file for complete search history.

(56) References Cited

U.S. PATENT DOCUMENTS 10,009,558 B2 * 6/2018 Lule .................. H01L 27/14605
2005/0110093 A1   5/2005 Altice et al.
(Continued)

OTHER PUBLICATIONS

Sakano et al., "224-ke Saturation Signal Global Shutter CMOS Image Sensor with in-Pixel Pinned Storage and Lateral Overflow Integration Capacitor," Symposium on VLSI Circuits Digest of Technical Papers, 2017, 2 pages.
(Continued)

*Primary Examiner* — James M Hannett
(74) *Attorney, Agent, or Firm* — Treyz Law Group, P.C.; Tianyi He

(57) ABSTRACT

An image sensor pixel may include a photodiode that generates first charge for a first frame and second charge for a second frame, first and second storage gates coupled to the photodiode, a floating diffusion coupled to the first storage gate through a first transistor, a second transistor coupled to the second storage gate, and a capacitor coupled to the floating diffusion through a third transistor. The image sensor pixel may output image signals associated with the first charge generated by the photodiode for the first image frame while the photodiode concurrently generates the second charge for the second image frame. The second storage gate may be used to store overflow charge. Overflow charge for the second frame may be stored at the second storage gate while image signals associated with the first image frame are read out from capacitor and the floating diffusion.

19 Claims, 7 Drawing Sheets

(56) References Cited

U.S. PATENT DOCUMENTS

| | | | |
|---|---|---|---|
| 2007/0272828 A1* | 11/2007 | Xu | H04N 5/361 |
| | | | 250/208.1 |
| 2013/0135486 A1* | 5/2013 | Wan | H04N 5/765 |
| | | | 348/207.99 |
| 2017/0244921 A1 | 8/2017 | Velichko | |
| 2017/0350755 A1 | 12/2017 | Geurts | |
| 2017/0366764 A1 | 12/2017 | Innocent et al. | |

OTHER PUBLICATIONS

De Wit et al., "An Overflow Photo-gate Pixel Enables High FWC and Improved Proton Radiation Tolerance in CMOS Pixels," IISS, 2013, 4 pages.

Geurts et al., "A 98dB Linear Dynamic Range, High Speed CMOS Image Sensor," IISS, 2017, 4 pages.

McCarten, U.S. Appl. No. 15/476,060, filed Mar. 31, 2017.

\* cited by examiner

IMAGING SYSTEMS HAVING DUAL STORAGE GATE OVERFLOW CAPABILITIES

BACKGROUND

This relates generally to imaging devices, and more particularly, to imaging devices having compact image sensor pixels with high dynamic range functionalities.

Image sensors are commonly used in electronic devices such as cellular telephones, cameras, and computers to capture images. Typical image sensors contain image pixels that include a photodiode for generating charge in response to incident light. Image sensors can operate using a global shutter or a rolling shutter scheme. In a global shutter scheme, every image pixel in the image sensor simultaneously captures an image, whereas in a rolling shutter each row of image pixels sequentially captures an image.

An image sensor has an associated dynamic range, which is expressed as a ratio of the largest and smallest possible luminance values for the image sensor. Image sensors are often equipped with high dynamic range (HDR) functionality, in which the image sensors capture images at extended dynamic ranges beyond what would otherwise be possible using image sensors without HDR functionality. One of the most common HDR techniques is multiple exposure imaging. In multiple exposure imaging, multiple images are captured with an image sensor at different exposure times and are later combined into a high dynamic range image. However, as the multiple exposures are captured at different times, it can be difficult to correctly capture images of moving objects. In addition, if care is not taken while performing HDR imaging, the image pixels in the image sensor can saturate and limit the signal-to-noise ratio of the final image.

It would therefore be desirable to be able to provide imaging devices with improved image sensor pixels.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
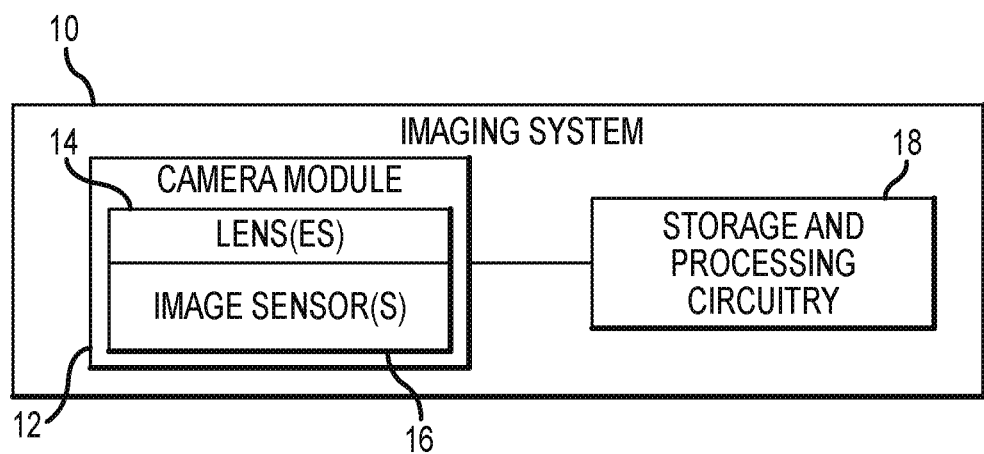
FIG. 1 is a diagram of an illustrative electronic device having an image sensor and processing circuitry for capturing images using an array of image sensor pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, etc.). Processed image data may, if desired, be provided to external equipment (e.g., a computer, external display, or other device) using wired and/or wireless communications paths coupled to processing circuitry 18.

Figure 2:
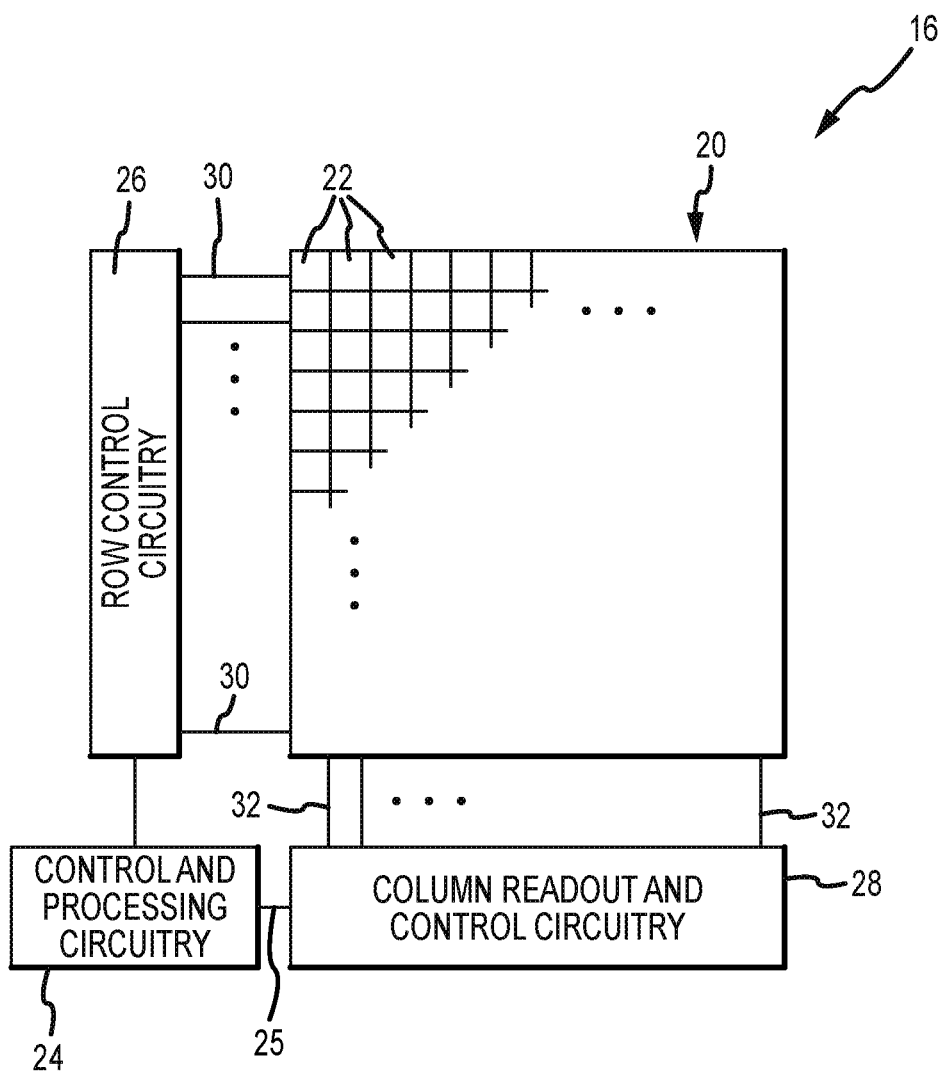
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 may be configured to support a global shutter operation (e.g., pixels 22 may be operated in a global shutter mode). For example, the image pixels 22 in array 20 may each include a photodiode, floating diffusion region, and local charge storage region. With a global shutter scheme, all of the pixels in the image sensor are reset simultaneously. A charge transfer operation is then used to simultaneously transfer the charge collected in the photodiode of each image pixel to the associated charge storage region. Data from each storage region may then be read out on a per-row basis, for example.

Figure 3:
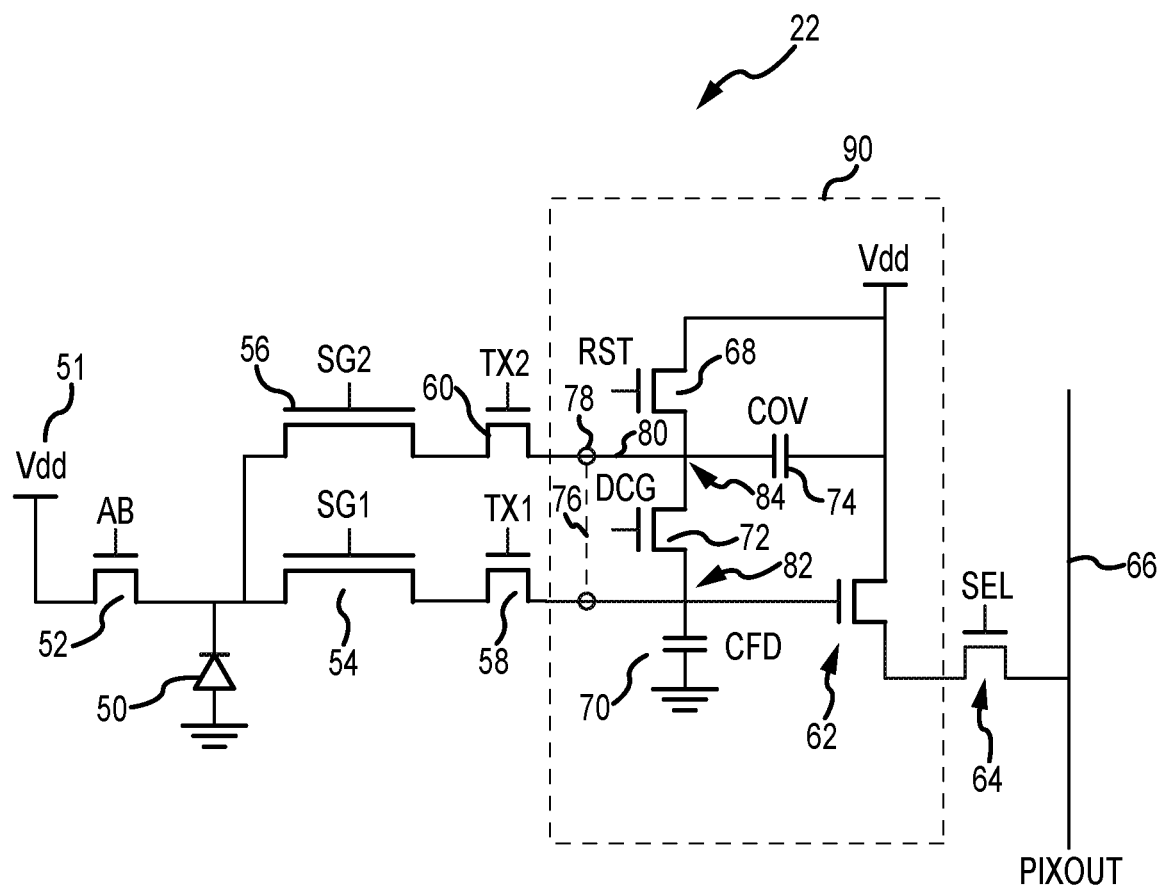
FIGS. 3 and 4 are circuit diagrams of an illustrative image sensor pixel configured to perform global shutter and high dynamic range imaging in a pipelined mode of operation using multiple storage gates in accordance with an embodiment.

FIG. 3 is a circuit diagram of an illustrative image sensor pixel 22. Pixel 22 may include photosensitive region 50 (e.g., photodiode 50). Photodiode 50 may receive incident light over a period of time (i.e., an exposure time) and may generate an image signal corresponding to the incident light over the exposure time. In conventional imaging systems, image artifacts may be caused by moving objects, moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars. Image signals generated with a short integration time and a short exposure time may miss the flickering light (e.g., the blinking light of the LED at a given frequency). However, by spreading the short integration time over a longer exposure time, there is less chance to miss the signal from the flickering light (e.g., pulse light source, LED). Pixel 22 may be designed to reduce artifacts associated flickering lighting by spreading a short integration time over a longer exposure time if desired. To implement flicker mitigation, photodiode 50 may be coupled to voltage source 51 with supply voltage Vdd through photodiode reset transistor 52 (sometimes referred to herein as anti-blooming transistor 52). When control signal AB is asserted (e.g., pulsed high), photodiode 50 may be reset to supply voltage Vdd. When control signal AB is deasserted (e.g., pulsed low), photodiode 50 may begin to accumulate charge from incident light. Subsequent to photodiode reset, a given integration period (exposure time) may begin and photodiode 50 may begin generating and storing an image signal.

Pixel 22 may include a first storage gate 56 and a second storage gate 54 coupled to photodiode 50 in parallel. Storage gates 56 and 54 may each include a corresponding transfer transistor and storage region, as an example. Storage gate 56 may be coupled to circuit node 84 via charge transfer transistor 60 and path 80. Charge storage capacitor 74 (sometimes referred to herein as overflow capacitor 74) may be coupled between circuit node 84 and supply voltage Vdd. Overflow capacitor 74 may exhibit a corresponding capacitance COV. Reset transistor 68 may be coupled between circuit node 68 and supply voltage Vdd in parallel with overflow capacitor 74. Reset transistor 68 may have a gate terminal that receives reset control signal RST.

Storage gate 54 may be coupled to floating diffusion node 82 via charge transfer transistor 58. Floating diffusion node 82 (sometimes referred to herein as floating diffusion region 58) may be a doped semiconductor region (e.g., a region in a silicon substrate that is doped by ion implantation, impurity diffusion, or other doping processes), for example. Floating diffusion node 82 may serve as another storage region for storing charge during image data gathering operations. Floating diffusion node 82 may have a charge storage capacity (capacitance) as shown by capacitor 70 having capacitance CFD.

Storage gate 56 may have a gate terminal that receives storage gate control signal SG2 and storage gate 54 may have a gate terminal that receives storage gate control signal SG1. Storage gate control signal SG2 may be adjusted to control the flow of charge accumulated on photodiode 50 into the storage region associated with storage gate 56. Storage gate control signal SG1 may be adjusted to control the flow of charge accumulated on photodiode 50 into the storage region associated with storage gate 54.

As an example, storage gate control signal SG2 may configure storage gate 56 to store excess (overflow) charge from photodiode 50 during the integration period and storage gate control signal SG1 may configure storage gate 54 to store remaining charge (e.g., non-overflow charge) from photodiode 50 after the integration period has been completed.

Charge transfer transistor 60 may have a gate terminal that receives charge transfer control signal TX2. Charge transfer transistor 58 may have a gate terminal that receives charge transfer control signal TX1. Transistor 72 (sometimes referred to herein as gain selection transistor 72, dual conversion gain (DCG) transistor 72, or overflow transistor 72) may be coupled between circuit node 84 and floating diffusion node 82. Transistor 72 may have a gate terminal that receives control signal DCG (sometimes referred to herein as dual conversion gain control signal DCG or overflow control signal DCG). When asserted, control signal DCG may turn transistor 72 on to couple overflow capacitor 74 to floating diffusion node 82, thereby extending the charge storage capacity of floating diffusion node 82 to also include overflow capacitance COV (and vice versa).

Charge transfer control signal TX2 may be pulsed to transfer charge stored at charge storage gate 56 onto overflow capacitor 74 (and onto floating diffusion node 82 when control signal DCG is asserted). Charge transfer control signal TX1 may be pulsed to transfer charge stored at charge storage gate 54 onto floating diffusion node 82 (and onto overflow capacitor COV when control signal DCG is asserted). Reset signal RST may be pulsed to reset overflow capacitor COV (and floating diffusion node 82 when control signal DCG is concurrently asserted) to supply voltage Vdd. In another suitable arrangement, reset transistor 68 and capacitor 74 may be coupled to a different supply voltage (e.g., a different supply voltage than is provided at terminal 51).

Storage gate 56 may include a corresponding source terminal, a drain terminal, a gate terminal, and a channel region. The charge storage region in storage gate 56 may be a doped-semiconductor region (e.g., a doped silicon region formed in a silicon substrate by ion implantation, impurity diffusion, or other doping techniques) that has charge storage capabilities (e.g., a capacitance). Photodiode 50 may be connected to a first terminal (e.g., a source or drain terminal) of storage gate 56. The storage region may be connected to a second terminal that opposes the first terminal. As an example, if the first terminal is the source terminal, the second terminal may be the drain terminal, or vice versa. Control signal SG2 may control both a flow of charge across the channel of storage gate 56 and a flow of charge into the corresponding storage region of storage gate 56. Control signal SG2 may be adjusted to a desired level so that excess (overflow) charge on photodiode 50 is transferred through the channel region of storage gate 56 and into the storage region of storage gate 56 during the integration time, for example.

Similarly, storage gate 54 may include a source terminal, a drain terminal, a gate terminal, and a channel region. The charge storage region in storage gate 54 may be a doped-semiconductor region (e.g., a doped silicon region formed in a silicon substrate by ion implantation, impurity diffusion, or other doping techniques) that has charge storage capabilities (e.g., a capacitance). Photodiode 50 may be connected to a first terminal (e.g., a source or drain terminal) of storage gate 54. The storage region may be connected to a second terminal that opposes the first terminal. As an example, if the first terminal is the source terminal, the second terminal may be the drain terminal, or vice versa. Control signal SG1 may control both a flow of charge across the channel of storage gate 54 and a flow of charge into the corresponding storage region of storage gate 54. When control signal SG1 is asserted (e.g., at the end of the integration period), charge stored in photodiode 50 (e.g., remaining charge on photodiode 54 after overflow charge has been transferred into the storage region of storage gate 56) may pass through the channel region of storage gate 54 and into the corresponding storage region associated with storage gate 54. Control signal SG1 may be subsequently deasserted and photodiode 50 may be reset to a supply voltage using control signal AB, if desired.

Pixel 22 may include readout circuitry that includes source follower transistor 62 and row select transistor 64. Transistor 64 may have a gate that is controlled by row select control signal SEL. When control signal SEL is asserted, transistor 64 is turned on and a corresponding signal PIX-OUT (e.g., an output signal having a magnitude that is proportional to the amount of charge at floating diffusion node 82 and/or overflow capacitor 74) is passed onto column readout path 66 (sometimes referred to herein as bus line 66). A correlated double sampling readout process may be used to sample the charge from floating diffusion 82 if desired. The correlated double sampling readout process may involve reading out reset level and image level signals from floating diffusion node 82 and capacitor 74 that are later subtracted from each other to account for noise associated with the reset level of the floating diffusion region.

Use of two storage gates may allow one of the storage gates (e.g., storage gate 56) to store overflow charge from photodiode 50, thereby mitigating saturation of pixel 50 in high light portions of an imaged scene. When configured in this way (e.g., as shown in FIG. 3), pixel 22 may gather high dynamic range images using a global shutter exposure scheme in a pipelined mode of operation. The pipelined mode of operation may allow for a subsequent frame to be integrated while the previous frame is still stored on pixel 22 and while the previous frame is read out from pixel 22 (e.g., optimizing speed and efficiency for pixel 22 in performing HDR imaging operations). For example, portions of the charge for a given frame (e.g., a given frame captured across array 20 during a global shutter exposure) may be stored at storage gate 54, floating diffusion node 82, and/or capacitor 74 and may be read out from pixel 22 while charge for the next frame (e.g., a subsequent frame captured across array 20 during a subsequent global shutter exposure) is accumulated at photodiode 50. Storage gate 56 may be free from charge associated with the given frame while the charge associated with the subsequent frame is accumulated at photodiode 50 so that any overflow charge associated with the subsequent frame may be transferred to and stored at storage gate 56, for example. Distributing and timing the charge storage capabilities during HDR operations in this way may expand the charge storage capacity of pixel 22 to prevent pixel saturation and to maximize signal-to-noise ratio in the output image signals, while also supporting a fast and efficient pipeline mode of operation, for example.

In the example of FIG. 3, charge may be integrated at photodiode 50 and the storage region associated with storage gate 56 (e.g., overflow charge may be accumulated at storage gate 56 while the rest of the charge is accumulated at photodiode 50). The example of FIG. 3 in which the charge storage regions associated with storage gates 56 and 54 are implemented using doped-semiconductor regions coupled to the respective channel and source/drain terminals of storage gates 54 and 56 is merely illustrative. In another suitable arrangement, the charge storage capabilities of storage gate 56 may be implemented using a diode coupled between storage gate 56 and transistor 60 or an additional transistor coupled between storage gate 56 and transistor 60 and/or the charge storage capabilities of charge storage gate 54 may be implemented using a diode coupled between storage gate 54 and transistor 58 or an additional transistor coupled between storage gate 54 and transistor 58. For example, storage gate 56 as shown in FIG. 3 may be replaced by a transistor having a gate terminal that receives control signal SG2 and a source/drain terminal coupled to transistor 60 through a circuit node, with a diode coupled between that circuit node and ground. Similarly, storage gate 54 as shown in FIG. 3 may be replaced by a transistor having a gate terminal that receives control signal SG1 and a source/drain terminal coupled to transistor 58 through an additional circuit node, with a diode coupled between the additional circuit node and ground. In another suitable arrangement, storage gate 54 and/or storage gate 56 as shown in FIG. 3 may be replaced by two transistors and a charge storage region coupled between source/drain terminals of the two transistors.

In yet another suitable arrangement, additional charge transfer transistors may be coupled between storage gate 54 and photodiode 50, between storage gate 56 and photodiode 50, between storage gate 56 and transistor 60, and/or between storage gate 54 and transistor 58 (e.g., to tweak the control scheme involved in transferring charge to the storage regions associated with storage gates 54 and 56). Generally, storage structures (e.g., charge storage associated with storage gates 54 and 56) may be formed between any two transfer transistors to allow for image signal integration in a low dark current environment and correlated double sampling readout.

In another suitable arrangement, transfer transistor 60 may be coupled directly to floating diffusion 82 instead of to circuit node 84. In this arrangement, conductive path 76 may be coupled between circuit node 78 and floating diffusion node 82 and conductive path 80 between circuit node 78 and circuit node 84 may be omitted. The source/drain terminal of transistor 60 opposite to storage gate 56 may be coupled to floating diffusion 82 through conductive path 76 and circuit node 78 (with an open circuit present between nodes 78 and 84). However, coupling circuit node 78 to circuit node 84 over path 80 may be simpler and more cost effective to manufacture than arrangements where circuit node 78 is coupled to floating diffusion node 82 over path 76, for example. The circuitry in pixel 22 of FIG. 3 may be stacked, shared with other pixels 22 in array 20, and/or combined with a doughnut-shaped photodiode if desired. If desired, pixel 22 may be formed using a coupled gate based photodiode operated using an LED flicker mitigation (LFM) timing scheme.

If desired, pixel 22 of FIG. 3 may be operated using multiple separate, shorter integration periods that are spread among the total exposure period for a given frame. In this scenario, the exposure period for a given frame may be divided into multiple shorter integration periods separated over the exposure period for the given frame. For example, a second shorter integration period and/or additional shorter integration periods for a given exposure period may follow a first shorter integration period. After each shorter integration period, corresponding charge may be transferred into storage gate 56 and/or storage gate 54. The charge from the second and/or additional shorter integration periods may be integrated (e.g., summed or added) with charge from the first integration period on storage gates 54 and/or 56. The integrated charge stored at storage gates 54 and 56 may be said to have an effective integration period. The effective integration period is the summation of the duration of the first shorter integration period and the durations of all subsequent shorter integration periods for the given frame. In general, any number of desired shorter integration periods (e.g., involving transfer of charge from distinct shorter integration periods to storage gates 56 and 54 for summation) may occur. The effective integration period may be generally defined as the summation of all of the distinct shorter integration periods, over which all of the respective individual charges were generated. By breaking up the effective integration period during an image frame into shorter, non-continuous integration periods that span a longer exposure time, image artifacts caused by moving objects, flickering lighting, and objects with changing illumination may be minimized without compromising pixel integration time (i.e., while maintaining the desired total integration time).

Figure 4:
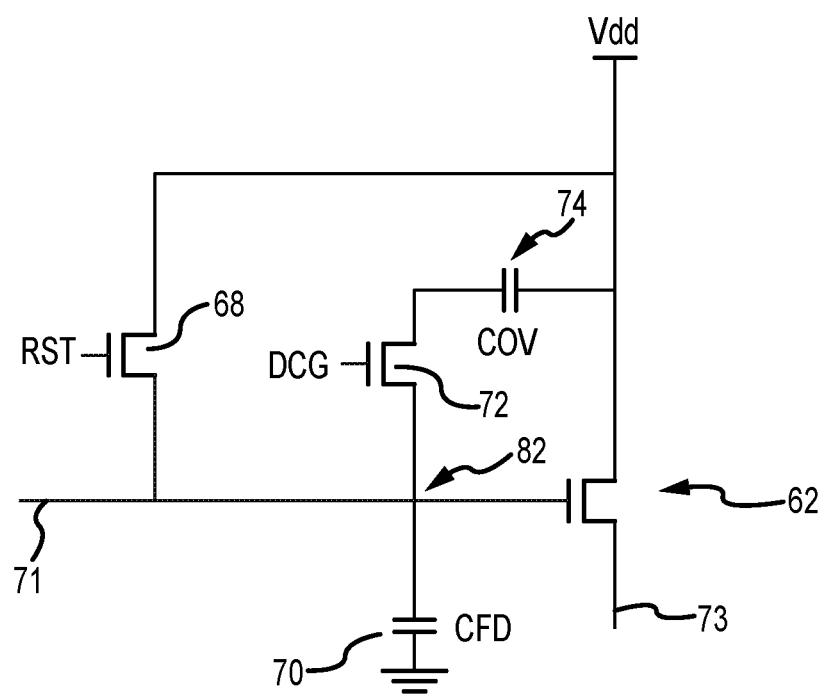

The example of FIG. 3 in which reset transistor 68 is configured to reset floating diffusion node 82 through overflow capacitor transistor 72 is merely illustrative. FIG. 4 is a circuit diagram showing an arrangement for pixel 22 in which reset transistor 68 is directly connected to floating diffusion node 82.

The circuitry shown in FIG. 4 may, for example, be used to replace the circuitry shown in dashed box 90 of FIG. 3. As shown in FIG. 4, path 71 may be coupled to the source/drain terminal of transistor 58 and the source/drain terminal of transistor 60 of FIG. 3 (e.g., over path 76 whereas path 80 of FIG. 3 is omitted in this arrangement). Path 73 of FIG. 4 may be coupled to row select transistor 64 of FIG. 3. In the arrangement of FIG. 4, reset transistor 68 is coupled directly to floating diffusion node 82 (e.g., transistors 68 and 72 may be coupled in parallel between supply voltage Vdd and floating diffusion node 82). Reset signal RST may be pulsed to reset floating diffusion node 82 using supply voltage Vdd (e.g., without requiring a concurrent assertion of control signal DCG). The example of FIG. 4 is merely illustrative and, if desired, other arrangements may be used for resetting floating diffusion node 82.

Figure 5:
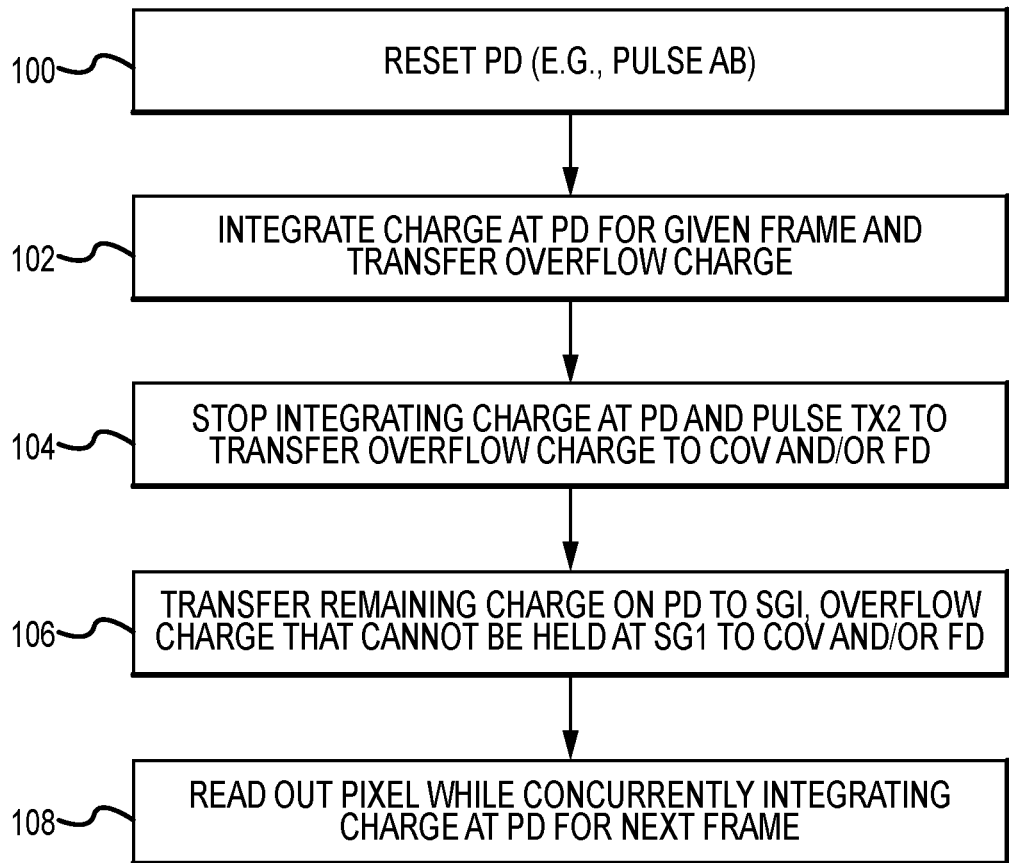
FIG. 5 is a flow chart of illustrative steps that may be performed by an image sensor having image sensor pixels of the types shown in FIGS. 3 and 4 for gathering high dynamic range images in a pipelined mode of operation using multiple storage gates in accordance with an embodiment.

FIG. 5 is a flow chart of illustrative steps that may be performed by image sensor 16 in operating pixel 22 of FIGS. 3 and 4 to gather HDR images using a global shutter exposure and a pipelined mode of operation.

As shown in FIG. 5, at step 100, photodiode 50 of FIG. 3 may be reset using supply voltage Vdd at terminal 51 (e.g., by pulsing control signal AB provided to the gate terminal of transistor 52). This is merely illustrative and, in general, any desired resetting scheme and arrangement may be used to reset photodiode 50 to any desired level.

At step 102, each of the pixels 22 in array 20 (FIG. 2) may begin to integrate charge for a given frame using a global shutter exposure scheme. Photodiode 50 in pixel 22 as shown in FIG. 3 may subsequently accumulate charge in response to received light for the given frame. If desired, any excess (overflow) charge from photodiode 50 during this integration may be transferred to storage gate 56 for storage. If desired, control circuitry 26 (FIG. 2) may adjust control signal SG2 to control the amount of overflow charge that is transferred from photodiode 50 to storage gate 56. The overflow charge may be stored at the charge storage associated with storage gate 56.

At step 104 (e.g., at the end of the integration period for the given frame), photodiode 50 may stop integrating charge and control signal TX2 may be pulsed to transfer the overflow charge stored at storage gate 56 onto capacitor 74 and/or floating diffusion node 82. For example, in scenarios where conductive path 76 is omitted and node 78 of FIG. 3 is directly coupled to circuit node 84, the overflow charge stored at storage gate 56 may be transferred onto capacitor 74 and, if signal DCG is asserted, may also be transferred onto floating diffusion node 82 through transistor 72 for storage. In scenarios where conductive path 76 of FIG. 3 is included and node 78 is not directly connected to node 84, the overflow charge stored at storage gate 56 may be transferred onto floating diffusion node 82 and, if signal DCG is asserted, may also be transferred onto capacitor 74. In scenarios where reset gate 68 is directly connected to floating diffusion node 82 (as shown in FIG. 4), the overflow charge stored at storage gate 56 may be transferred onto floating diffusion node 82 and, if signal DCG is asserted, may also be transferred onto capacitor 74.

At step 106, the remaining charge on photodiode 50 (e.g., the integrated charge that was not transferred to storage gate 56 during step 102) may be transferred to storage gate 54 for storage. If desired, control circuitry 26 (FIG. 2) may adjust control signal SG1 to control the transfer of the remaining charge onto the charge storage associated with storage gate 56. Any excess (overflow) charge that cannot be stored at storage gate 54 (e.g., due to the potentially limited storage capacity of storage gate 54) may be transferred to floating diffusion node 82 and/or capacitor 74 (if signal control DCG is concurrently asserted) via transistor 78 (e.g., control signal TX1 may be adjusted to control the amount of overflow charge transferred onto floating diffusion node 82). The example of FIG. 5 is merely illustrative and, if desired, steps 102 through 106 may be modified to divide the exposure period of the given frame into multiple shorter integration periods during which charge transfer is transferred to storage gate 54 and then subsequently to storage gate 56 (or to storage gate 56 and then subsequently to storage gate 54) (e.g., during alternating shorter integration periods). Dividing the exposure time of the given frame up into shorter integration periods may, for example, mitigate artifacts associated with moving objects in the final image.

At step 108, readout circuitry 28 (FIG. 2) may read out signals (e.g., pixel values PIXOUT of FIG. 3) from pixel 22 that are associated with the charge stored at storage gate SG1, floating diffusion node 82, and/or capacitor 74 at the end of step 106. Pixel 22 may be operated in a pipelined mode of operation in which each of the pixels 22 in array 20 begin to accumulate the next image frame using a global shutter exposure process while pixel 22 is being read out. From a first iteration of step 106 onwards, control signal SG1 may be used for the next integration cycle and the read-out shall have ended. Photodiode 50 may thereby begin to accumulate charge associated with the next image frame concurrently with the readout of signals from pixel 22. Storage gate 56 may also store overflow charge for this next image frame while signals for the given frame are read out from pixel 22 (e.g., processing may loop back to step 102 but for the next image frame while readout is completed for the given image frame). Pixel 22 may be read out using an HDR readout scheme or any other desired readout scheme. Reset level and image level signals may be read out from pixel 22 using a correlated double sampling scheme if desired. Operating pixel 22 in the pipelined mode of operation in which signals are readout from pixel 22 for the given frame while pixel 22 integrates charge for the next frame may optimize the speed and efficiency of pixel 22, for example.

Consider one possible example for the readout process performed while processing step 108 of FIG. 5. In this example, a signal associated with the charge stored on capacitor 74 and floating diffusion node 82 may first be read out on line 66 through row select transistor 64 (e.g., while control signal SEL of FIG. 3 is asserted). This signal may serve as an image level low gain signal (e.g., a low gain signal associated with the overflow charge stored at storage gate 56 while processing step 102 and any overflow charge from storage gate 54 transferred while processing step 106). This image level low gain signal may also serve as a reset level high gain signal in a correlated double sampling process.

Next, transistor 58 may be turned on (e.g., by pulsing signal TX1) to transfer the remaining charge stored on storage gate 54 onto floating diffusion node 82 (and onto capacitor 74 if control signal DCG is concurrently asserted).

A signal associated with this charge may then be read out on line 66 through row select transistor 64. This signal may serve as an image level high gain signal (e.g., a high gain signal associated with the charge stored at storage gate 54 while processing step 106). Readout circuitry 28 (FIG. 2) or other processing circuitry may subtract the read out reset level high gain signal from the read out image level high gain signal to generate a high gain image signal that has been compensated for readout noise.

Next, reset signal RST provided to reset transistor 68 may be asserted (e.g., concurrently with asserting control signal DCG provided to transistor 72) to reset capacitor 74 and floating diffusion node 82 (e.g., using supply voltage Vdd). A signal associated with the reset voltage may then be read out on line 66 through row select transistor 64. This signal may serve as a reset level low gain signal. Readout circuitry 28 or other processing circuitry may subtract the read out reset level low gain signal from the read out image level low gain signal to generate a low gain image signal that has been compensated for readout noise. The low gain image signal may be combined with the high gain image signal to generate an HDR image signal for pixel 22 that has been compensated for read out noise and that has an optimal SNR. HDR image signals generated by each pixel 22 across array 20 may be combined to generate a final HDR image for the given image frame. This example is merely illustrative and, in general, any desired HDR readout scheme or any other desired readout scheme may be used.

Figure 6:
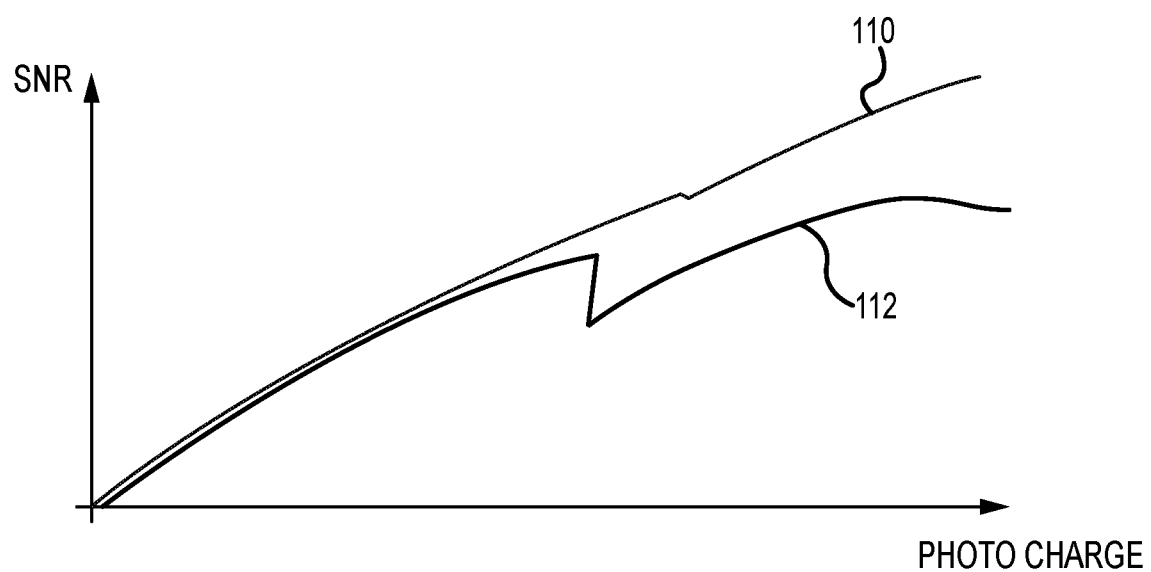
FIG. 6 is an illustrative plot of signal-to-noise ratio (SNR) as a function of gathered photo charge for image sensor pixels of the types shown in FIGS. 3 and 4 in accordance with an embodiment.

FIG. 6 is an illustrative plot of SNR as a function of the amount of photo charge generated by photodiode 50. Curve 112 illustrates the SNR of the image signals generated by a conventional image pixel. As shown in FIG. 6, curve 112 approaches a limited SNR threshold after a certain amount of charge has been generated at the pixel photodiode. This SNR limit may, for example, be caused by charge saturation in the conventional pixel. Curve 110 illustrates the SNR of the image signals generated by pixel 22 of FIGS. 3 and 4. As shown in FIG. 6, curve 110 does not taper off for the relatively high amount of photo charge that would otherwise saturate the conventional pixel. In other words, pixel 22 may continue to accumulate charge with an increased SNR even for relatively large amounts of generated image charge relative to conventional pixels. The example of FIG. 6 is merely illustrative and, in general, the SNR curve associated with pixel 22 may have other shapes or characteristics.

Figure 7:
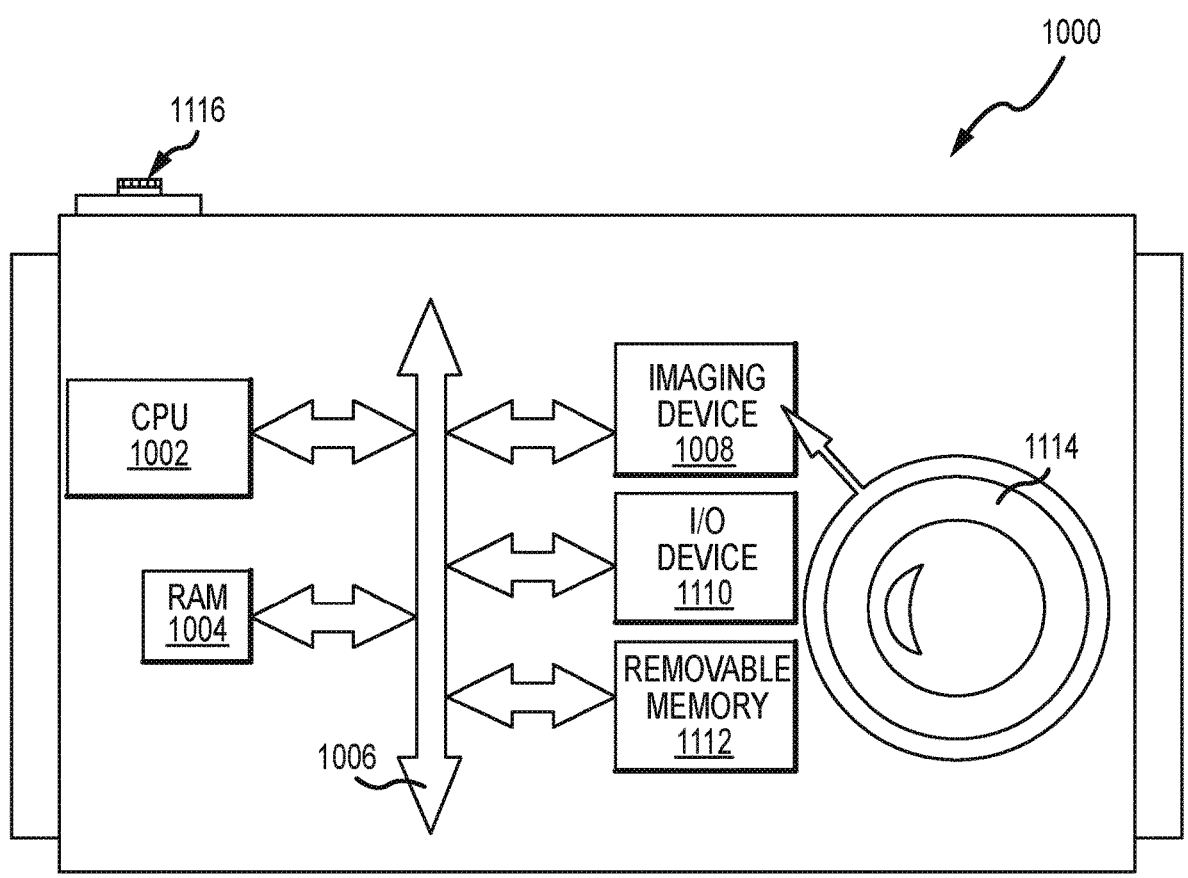
FIG. 7 is a block diagram of a processor system employing the embodiments of FIGS. 1-6 in accordance with an embodiment.

FIG. 7 is a simplified diagram of an illustrative processor system 1000, such as a digital camera, which includes an imaging device 1008 (e.g., the camera module of FIG. 1) employing an imager having pixels as described above in connection with FIGS. 1-6. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel arrays in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods for generating images using image sensor pixels having high dynamic range functionalities.

An image sensor pixel may include a photodiode that generates charge in response to incident light, a first storage gate coupled to the photodiode, a second storage gate coupled to the photodiode, first, second, and third transistors, a floating diffusion region coupled to the first storage gate through the first transistor, and a capacitor coupled to the second storage gate through the second transistor, wherein the capacitor is coupled to the floating diffusion region through the third transistor. The image sensor pixel may include a circuit node coupled between the second transistor, the third transistor, and the capacitor, and may include a reset transistor coupled between a power supply voltage and the circuit node. A source follower may have a gate terminal coupled to the floating diffusion region, a first terminal coupled to a pixel readout line via a row select transistor, and a second terminal coupled to the capacitor and the power supply voltage.

The second storage gate may include a gate terminal that is controlled to transfer an overflow charge generated by the photodiode onto storage (e.g., a doped semiconductor region or a diode) associated with the second storage gate. The first storage gate may include a gate terminal that is controlled to transfer remaining charge that remains on the photodiode after the overflow charge has been transferred to the second storage gate. The second and third transistors may be configured to transfer the overflow charge from the second storage gate onto the capacitor and the floating diffusion region. The image sensor pixel may output a low gain image signal associated with the overflow charge transferred onto the capacitor and the floating diffusion region. The first and third transistors may be configured to transfer the remaining charge from the first storage gate onto the floating diffusion region and the capacitor after the low gain image signal has been output by the image sensor pixel. The image sensor pixel may subsequently output a high gain image signal associated with the remaining charge transferred onto the floating diffusion and the capacitor.

In another suitable arrangement, an image sensor pixel may be coupled to a pixel readout path and may include a photodiode configured to generate a first charge for a first image frame and a second charge for a second image frame subsequent to the first image frame. The image sensor pixel may include a first storage gate coupled to the photodiode, a second storage gate coupled to the photodiode, first, second, and third transistors, a floating diffusion region coupled to the first storage gate through the first transistor, where the second transistor is coupled to the second storage gate, and a capacitor is coupled to the floating diffusion region through the third transistor. The image sensor pixel may output image signals associated with the first charge generated by the photodiode for the first image frame onto the pixel readout path while the photodiode concurrently generates the second charge for the second image frame. If desired, the second transistor may be coupled to the capacitor and may be coupled to the floating diffusion region through the third transistor. If desired, the second transistor may be coupled to the floating diffusion region and may be coupled to the capacitor through the third transistor.

The first storage gate may store a first portion of the first charge, the second storage gate may store a second portion of the first charge, the second transistor may transfer the second portion of the first charge to the capacitor, and the second storage gate may store a portion of the second charge after the second portion of the first charge has been transferred to the capacitor and while at least some of the image signals associated with the first charge are concurrently output onto the pixel readout path by the image sensor pixel. The second storage gate may store the portion of the second charge while the first storage gate stores the first portion of the first charge.

In another suitable arrangement, a method of operating the image sensor pixel may be provided. The method may involve using the photodiode to integrate a first charge for a given image frame. The second storage gate may store an overflow portion of the first charge for the given image frame. The second and third transistors may transfer the overflow portion of the first charge to the capacitor and the floating diffusion node. The second storage diode may store a remaining portion of the first charge after the overflow portion of the first charge has been transferred to the capacitor and the floating diffusion node. The photodiode may integrate a second charge for a subsequent image frame while an image signal associated with the transferred overflow portion of the first charge is concurrently read out from the image sensor pixel. If desired, the second storage gate may store an overflow portion of the second charge for the subsequent image frame while the image signal associated with the transferred overflow portion of the first charge is concurrently read out from the image sensor pixel.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
   a photodiode that generates charge in response to incident light;
   a first storage gate coupled to the photodiode, wherein the first storage gate comprises a first charge storage region;
   a second storage gate coupled to the photodiode, wherein the second storage gate comprises a second charge storage region;
   first, second, and third transistors;
   a floating diffusion region coupled to the first storage gate through the first transistor; and
   a capacitor coupled to the second charge storage region of the second storage gate through the second transistor, wherein the capacitor is coupled to the floating diffusion region through the third transistor, and wherein the third transistor has first and second terminals, the first transistor being coupled to the first terminal of the third transistor and the second transistor being coupled to the second terminal of third transistor.

2. The image sensor pixel defined in claim 1, wherein a circuit node is coupled between the second transistor, the third transistor, and the capacitor, the image sensor pixel further comprising:
   a reset transistor coupled between a power supply voltage source and the circuit node, wherein the capacitor is coupled between the circuit node and the power supply voltage source.

3. The image sensor pixel defined in claim 2, wherein the first, second, third, and reset transistors are controlled using respective first, second, third, and reset control signals, wherein the reset control signal is adjusted to reset the capacitor using the power supply voltage source, and wherein the third control signal is asserted concurrently with adjusting the reset signal to reset the floating diffusion region using the power supply voltage source.

4. The image sensor pixel defined in claim 2, further comprising:
a source follower transistor having a gate terminal coupled to the floating diffusion region, a first terminal coupled to a pixel readout line via a row select transistor, and a second terminal coupled to the capacitor and the power supply voltage source.

5. The image sensor pixel defined in claim 1, wherein the first storage gate comprises a fourth transistor with a first gate terminal that receives a first control signal and the first charge storage region is formed from doped semiconductor, and wherein the second storage gate comprises a fifth transistor with a second gate terminal that receives a second control signal and the second charge storage region is formed from doped semiconductor.

6. The image sensor pixel defined in claim 1, wherein the second storage gate is configured to store an overflow charge generated by the photodiode and wherein the first storage gate is configured to store a remaining charge that remains on the photodiode after the overflow charge has been transferred to the second storage gate.

7. The image sensor pixel defined in claim 6, wherein the second and third transistors are configured to transfer the overflow charge from the second storage gate onto the capacitor and the floating diffusion region.

8. The image sensor pixel defined in claim 7, wherein the image sensor pixel is configured to output a low gain image signal associated with the overflow charge transferred onto the capacitor and the floating diffusion region, and wherein the first and third transistors are configured to transfer the remaining charge from the first storage gate onto the floating diffusion region and the capacitor after the low gain image signal has been output by the image sensor pixel.

9. The image sensor pixel defined in claim 8, wherein the image sensor pixel is configured to output a high gain image signal associated with the remaining charge transferred onto the floating diffusion and the capacitor.

10. The image sensor pixel defined in claim 9, wherein the photodiode is configured to generate the remaining charge and the overflow charge during an exposure time associated with a given image frame, and wherein the photodiode is configured to generate additional charge during a subsequent exposure time associated with a subsequent image frame while the low gain image signal is being output by the image sensor pixel.

11. The image sensor pixel defined in claim 1, wherein the photodiode is configured to generate the charge during an exposure time associated with a given image frame and wherein the first and second storage gates are configured to store portions of the generated charge during a series of alternating shorter integration times that are distributed over time throughout the exposure time associated with the given image frame.

12. An image sensor pixel, comprising:
a photodiode that generates charge in response to incident light;
a first storage gate coupled to the photodiode;
a second storage gate coupled to the photodiode;
a first charge transfer transistor coupled to the photodiode through the first charge storage gate;
a second charge transfer transistor coupled to the photodiode through the second charge storage gate;
a photodiode reset transistor coupled to the photodiode;
a floating diffusion region coupled to the first storage gate through the first charge transfer transistor, wherein the second storage gate is operable to store an overflow charge generated by the photodiode and wherein the first storage gate is operable to store a remaining charge that remains on the photodiode after the overflow charge has been transferred to the second storage gate;
a gain selection transistor coupled to the floating diffusion region; and
a capacitor coupled to the floating diffusion region through the gain selection transistor.

13. The image sensor pixel defined in claim 12, wherein second charge transfer transistor is coupled to the capacitor and wherein the second charge transfer transistor is coupled to the floating diffusion region through the gain selection transistor.

14. The image sensor pixel defined in claim 13, wherein a circuit node is coupled between the second charge transfer transistor, the gain selection transistor, and the capacitor, the capacitor is coupled between the circuit node and a power supply voltage, and the image sensor pixel further comprises:
a reset transistor coupled between the circuit node and the power supply voltage in parallel with the capacitor.

15. The image sensor pixel defined in claim 12, wherein the second charge transfer transistor is coupled to the floating diffusion region and wherein the second charge transfer transistor is coupled to the capacitor through the gain selection transistor.

16. The image sensor pixel defined in claim 15, wherein the capacitor is coupled between the gain selection transistor and a power supply voltage, the image sensor pixel further comprising:
a reset transistor coupled between the power supply voltage and the floating diffusion region.

17. The image sensor pixel defined in claim 12, wherein the photodiode is operable to generate a first charge for a first image frame and a second charge for a second image frame subsequent to the first image frame, wherein the image sensor pixel is operable to output image signals associated with the first charge generated by the photodiode for the first image frame onto a pixel readout path while the photodiode concurrently generates the second charge for the second image frame.

18. The image sensor pixel defined in claim 17, wherein the first charge comprises the overflow charge and the remaining charge, wherein at least the second transistor is operable to transfer the overflow charge to the capacitor, wherein the second storage gate is operable to store an overflow portion of the second charge after the overflow charge of the first charge has been transferred to the capacitor and while at least some of the image signals associated with the first charge are concurrently output onto the pixel readout path by the image sensor pixel.

19. A method of operating an image sensor pixel having a photodiode, a floating diffusion region, a capacitor, a first storage gate coupled to the photodiode, a second storage gate coupled to the photodiode, a first transistor coupled between the first storage gate and a floating diffusion region, a second transistor coupled to the second storage gate, and a third transistor coupled between the capacitor and the floating diffusion region, the method comprising:

with the photodiode, integrating a first charge for a given image frame;

with the second storage gate, storing an overflow portion of the first charge for the given image frame;

with the second and third transistors, transferring the overflow portion of the first charge to the capacitor and the floating diffusion region;

with the first storage gate, storing a remaining portion of the first charge after the overflow portion of the first charge has been transferred to the capacitor and the floating diffusion region;

with the photodiode, integrating a second charge for a subsequent image frame while an image signal associated with the transferred overflow portion of the first charge is concurrently read out from the image sensor pixel; and with the second storage gate, storing an overflow portion of the second charge for the subsequent image frame while the image signal associated with the transferred overflow portion of the first charge is concurrently read out from the image sensor pixel.

* * * * *